US009476913B2

(12) United States Patent
Fukasawa et al.

(10) Patent No.: US 9,476,913 B2
(45) Date of Patent: Oct. 25, 2016

(54) PROBE CARD

(71) Applicant: Shinko Electric Industries Co., Ltd., Nagano-shi, Nagano (JP)

(72) Inventors: Ryo Fukasawa, Nagano (JP); Michio Horiuchi, Nagano (JP); Yasue Tokutake, Nagano (JP); Yuichi Matsuda, Nagano (JP); Mitsuhiro Aizawa, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 14/327,745

(22) Filed: Jul. 10, 2014

(65) Prior Publication Data

US 2015/0022230 A1     Jan. 22, 2015

(30) Foreign Application Priority Data

Jul. 19, 2013   (JP) .................................. 2013-150337

(51) Int. Cl.
G01R 1/073     (2006.01)

(52) U.S. Cl.
CPC ................... G01R 1/07371 (2013.01)

(58) Field of Classification Search
CPC .... G01R 3/00; G01R 1/073; G01R 1/07314; G01R 1/07342; G01R 31/2601; G01R 31/2886; G01R 31/00; G01R 1/07371
USPC ................................................... 324/756.03
See application file for complete search history.

(56) References Cited

U.S. PATENT DOCUMENTS

| | | | |
|---|---|---|---|
| 6,100,815 A * | 8/2000 | Pailthorp | 324/754.07 |
| 6,236,112 B1 * | 5/2001 | Horiuchi et al. | 257/734 |
| 7,030,633 B1 * | 4/2006 | Qiu et al. | 324/719 |
| 7,148,576 B2 | 12/2006 | Nemoto | |
| 7,884,632 B2 * | 2/2011 | Shiraishi et al. | 324/750.25 |
| 2003/0062631 A1 | 4/2003 | Nemoto | |

(Continued)

FOREIGN PATENT DOCUMENTS

| | | |
|---|---|---|
| JP | S59-154054 | 9/1984 |
| JP | H09-229963 | 9/1997 |

(Continued)

OTHER PUBLICATIONS

Takehash I, Nobuitsu, machine translation of JP 09229963 A, Sep. 1997.*

(Continued)

*Primary Examiner* — Jermele M Hollington
*Assistant Examiner* — Khristopher Yodichkas
(74) *Attorney, Agent, or Firm* — Kratz, Quintos & Hanson, LLP

(57) ABSTRACT

A probe card includes a wiring substrate including an opening portion, a first connection pad, and a second connection pad arranged in an opposite area to the first connection pad, a resin portion formed in the opening portion, a first wire buried in the resin portion, in which one end is connected to the first connection pad and other end constitutes a first contact terminal, and a second wire buried in the resin portion, in which one end is connected to the second connection pad and other end constitutes a second contact terminal, wherein the first and second wires extend on one line, and the first and second contact terminals are arranged on the one line, and the first and second contact terminals are gathered to be separated such that the first and second contact terminals touch one electrode pad of a text object with a pair.

6 Claims, 11 Drawing Sheets

(56) References Cited

U.S. PATENT DOCUMENTS

| | | | |
|---|---|---|---|
| 2005/0057235 A1* | 3/2005 | Watanabe | 323/273 |
| 2006/0109022 A1* | 5/2006 | Yoshida et al. | 324/765 |
| 2009/0008641 A1* | 1/2009 | Michimata et al. | 257/48 |
| 2011/0062596 A1* | 3/2011 | Murayama | H01L 21/568 257/777 |
| 2014/0125372 A1* | 5/2014 | Fukasawa et al. | 324/756.03 |
| 2015/0022229 A1* | 1/2015 | Fukasawa et al. | 324/756.03 |
| 2015/0137849 A1* | 5/2015 | Horiuchi et al. | 324/756.03 |

FOREIGN PATENT DOCUMENTS

| | | |
|---|---|---|
| JP | 2000-294311 | 10/2000 |
| JP | 2003-174120 A1 | 6/2003 |

OTHER PUBLICATIONS

Nemoto, Yoshihiko, machine translation of JP 2003174120 A, Jun. 2003.*

* cited by examiner (partially enlarged view)

(partially enlarged view)

(partially enlarged view)

PROBE CARD

CROSS-REFERENCE TO RELATED APPLICATIONS

This application is based upon and claims the benefit of priority of the prior Japanese Patent Application No. 2013-150337, filed on Jul. 19, 2013, the entire contents of which ace incorporated herein by reference.

FIELD

This invention is related to a probe card and a method of manufacturing the same.

BACKGROUND ART

Measurement of electric characteristics of a test object such as a wiring substrate or the like is performed by touching contact terminals of a probe card to many electrode pads of the test object and attaining conduction therebetween.

A related art is disclosed in Japanese Laid-open Patent Publication No. 59-154054, Japanese Laid-open Patent Publication No. 09-229963, Japanese Laid-open Patent Publication No. 2000-294311, and Japanese Laid-open Patent Publication No. 2003-174120.

SUMMARY

As a method for accurately measuring electric characteristics of a test object, there is four-terminal testing in which electric measurement is performed by touching two adjacent contact terminals to one electrode pad of the test object. In the probe cards for four-terminal test, it is necessary that further narrower pitch of the contact terminals is advanced, but it is difficult to response by the manufacturing methods of the prior art.

According to one aspect discussed herein, there is provided a probe card, including a wiring substrate including an opening portion, a first connection pad formed on a first face of the wiring substrate and arranged in one area of a periphery of the opening portion, a second connection pad formed on the first face of the wiring substrate and arranged in another area of a periphery of the opening portion, the another area which is opposed to the first connection pad, a resin portion formed in the opening portion of the wiring substrate, a first wire buried in the resin portion, the first wire in which one end is connected to the first connection pad and of end constitutes a first contact terminal protruding from a lower face of the resin portion, and a second wire buried in the resin portion, the second wire in which one end is connected to the second connection pad and other end constitutes a second contact terminal protruding from the lower face of the resin portion, wherein the first wire and the second wire extend on one line, and the first contact terminal and the second contact terminal are arranged side by side on the one line, and the first contact terminal and the second contact terminal are gathered to be separated each other such that the first and second contact terminals touch one electrode pad of a test object with a pair.

Also, according to another aspect discussed herein, there is provided a method of manufacturing a probe card, including preparing a wiring substrate including an opening portion, a first connection pad and a second connection pad, the first connection pad arranged in one area of a periphery of the opening portion, the second connection pad arranged in another area of a periphery of the opening portion, the another area which is opposed to the first connection pad, bonding the wiring substrate to a metal base material, connecting the first connection pad, a terminal position in the metal base material, and the second connection pad by a wire sequentially to form a bonding portion at the terminal position in the metal base material, forming a resin portion in the opening portion of the wiring substrate, the resin portion burying the wire, removing the metal base material, removing the bonding portion from the wire by polishing the resin portion from a lower face thereof, to separate into a first wire connected to the first connection pad and a second wire connected to the second connection pad, and obtaining a first contact terminal and a second contact terminal by removing the resin portion from the lower face thereof such that tip parts of the first wire and the second wire protrude from the lower face of the resin portion respectively, wherein the first wire and the second wire extend on one line, and the first contact terminal and the second contact terminal are arranged side by side on the one line, and the first contact terminal and the second contact terminal are gathered to be separated each other such that the first and second contact terminals touch one electrode bad of a test object with a pair.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Hereinbelow, embodiments will be explained with reference to the accompanying drawings.

(First Embodiment)

FIGS. 1A to 5C are views depicting a method of manufacturing a probe card of a first embodiment. FIG. 6 is a view depicting a probe card of the first embodiment. In this embodiment, while explaining of the method of manufacturing a probe card, a structure of the probe card will be explained.

Figure 1A:
FIGS. 1A to 1F are cross-sectional views depicting a method of manufacturing a probe card of a first embodiment (Part 1).

In the method of manufacturing a probe card of the first embodiment, as depicted in FIG. 1A, first, a copper (Cu) foil 10 whose thickness is about 200 μm is prepared. A nickel (Ni) foil or the like may be used instead of the copper foil 10.

Figure 1B:
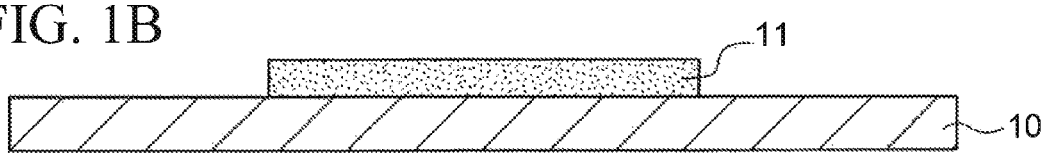
Figure 1C:
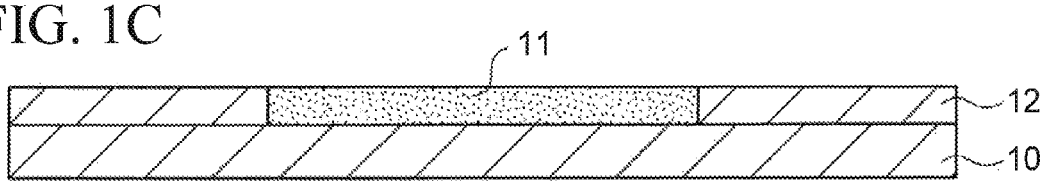

Then, as depicted in FIG. 1B, a plating resist layer 11 is formed by photolithography on the copper foil 10 in a center area having a quadrangle shape. Further, as depicted in FIG. 1C, a copper layer 12 is formed on the exposed face of the copper foil 10 by electroplating utilizing the copper foil 10 as a plating power feeding path. The thickness of the copper layer 12 is set to about 10 μm to 100 μm.

Figure 1D:
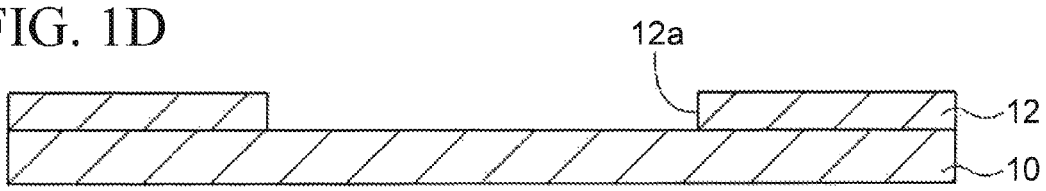

Thereafter, as depicted in FIG. 1D, the plating resist layer 11 is removed. By this matter, a frame-shaped copper layer 12 is thickly formed on a peripheral part of the copper foil 10, and a concave portion 12a is formed in the center area of the copper layer 12.

Besides this method, a resist layer in which an opening portion is provided in a center area may be patterned on a copper foil 10 having a thick thickness and, while using this resist layer as a mask, the cooper foil 10 may be etched until a halfway position in the thickness direction to form a concave portion therein.

Figure 1E:

Then, as depicted in FIG. 1E, a plating resist layer 13 in which an opening portion 13a is arranged in the center area of the copper foil 10 is formed by photolithography. The opening portion 13a of the plating resist layer 13 is arranged to an inside of the concave portion 12a of the copper layer 12. Specifically, the plating resist layer 13 is arranged so as to cover the inner wall face and an outer peripheral part of the bottom face of the concave portion 12a of the copper layer 12.

Figure 1F:
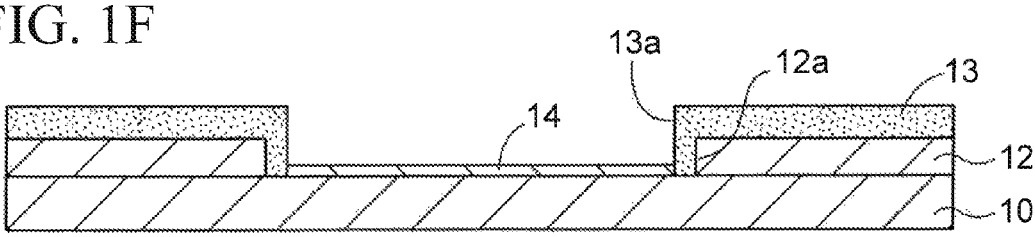
Figure 2A:
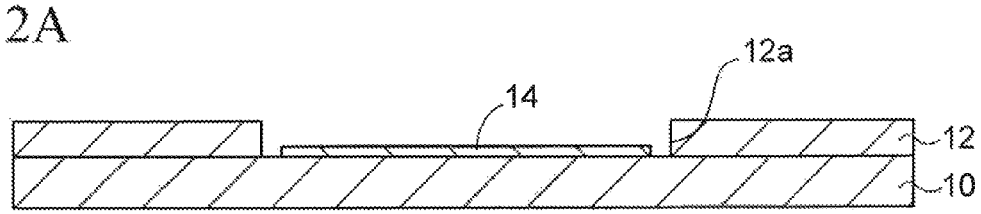
FIGS. 2A to 2C are cross-sectional views depicting the method of manufacturing a probe card of the first embodiment (Part 2).

Subsequently, as depicted in FIG. 1F, a gold layer 14 is formed on the copper foil 10 in the opening portion 13a of the plating resist layer 13 by electroplating utilizing the copper foil 10 as a plating power feeding path. Subsequently, as depicted in FIG. 2A, the plating resist layer 13 is removed.

By this matter, it is in a state that the gold layer 14 is arranged on the copper foil 10 in the concave portion 12a of the copper layer 12. The gold layer 14 is formed as an adhesion layer at the time that the gold wires are bonded on the copper foil 10 by wiring bonding method, and a thickness of the gold layer 14 is set to about 100 nm to 400 nm, for example.

At the time of forming the plating resist layer 13 in FIG. 1E, a plurality of pad-shaped opening patterns may be formed according to the positions at which the gold wires are to be bonded, described later, and a gold plating layer 14 may be formed in the opening patterns.

As described above, as a preferred example of a metal base material, this embodiment uses the member in which the frame-shaped copper layer 12 is stacked on the peripheral part of the copper foil 10, and the gold layer 14 is formed in the bottom of the concave portion 12a of the copper layer 12. In the case of using a nickel foil instead of the copper foil 10, a frame-shaped nickel layer may be formed similarly by electroplating instead of the copper layer 12.

Figure 2B:

Then, as depicted in FIG. 2B, a frame-shaped wiring substrate 5 is prepared in which a quadrangle opening portion 5a penetrating in the thickness direction is provided in the center. In the wiring substrate 5, first wiring layers 31 are formed on a first insulating layer 21.

A second insulating layer 22 in which first via holes VH1 are provided is formed on the first insulating layer 21, the first via holes VH1 reaching the first wiring layers 31. Second wiring layers 32 are formed on the second insulating layer 22, the second wiring layers 32 being connected to the first wiring layers 31 through the first via holes VH1.

Further likewise, a third insulating layer 23 in which second via holes VH2 are provided is formed on the second insulating layer 22, the second via holes VH2 reaching the second wiring layers 32. Third wiring layers 33 are formed on the third insulating layer 23, the third wiring layers 33 being connected to the second wiring layers 32 through the second via holes VH2.

The first to third insulating layers 21, 22, 23 are formed of resin or the like. The first to third wiring layers 31, 32, 33 are formed of copper or the like.

The side face of the opening portion 5a of the wiring substrate 5 is formed in a step shape. The first insulating layer 21 has a frame-shaped first step face S1 protruding inwardly from the end of the second insulating layer 22. Moreover, the second insulating layer 22 has a frame-shaped second step face S2 protruding inwardly from the end of the third insulating layer 23. Then, first connection pads P1 are formed on the first step face S1 and the second step face S2.

Further, the frame area opposite to the frame area in the wiring substrate 5 where the first connection pads P1 are arranged, through the opening portion 5, has a similar structure as well, and the second connection pads P2 are formed on the first step face S1 and the second step face S2, The first and second connection pads P1, P2 are connected to the first and second. wiring layers 31, 32, respectively. Moreover, each of the first and second connection pads P1, P2 includes a contact layer (not depicted) such as a nickel/gold plating layer at its surface.

In this way, the first connection pads 21 and the second connection pads 22 are arranged in the areas which are opposed each other through the opening portion 5a. In this embodiment, the first connection pads P1 and the second connection pads P2 only need to be arranged at least in a pair of opposite frame areas of the wiring substrate 5. However, the other pair of opposite frame areas of the wiring substrate 5 may have a similar structure as well.

The surface area of the opening portion 5a of the wiring substrate 5 is set to a surface area one size larger than the surface area of the concave portion 12a of the copper layer 12 mentioned above.

Various members can be used as the wiring substrate 5. For example, a printed wiring substrate using glass epoxy resin for a substrate is employed, thus the cost reduction is possible.

In this way, the wiring substrate 5 is prepared which includes the opening portion 5a, the first connection pads P1 arranged in one area of the periphery thereof, and the second connection pads P2 arranged in the opposite area to the first connection pads P1 through the opening portion 5a.

Figure 2C:
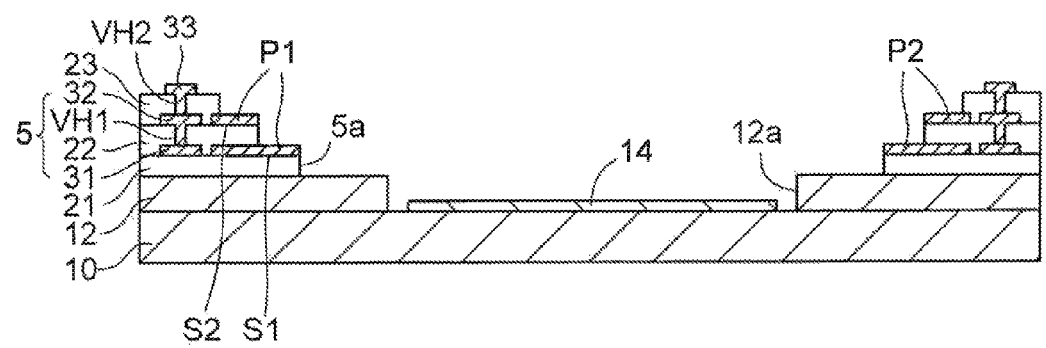
Figure 3A:
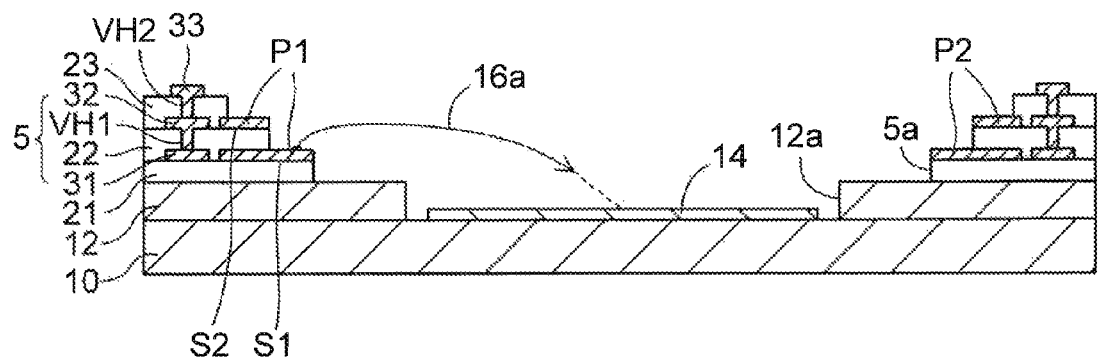
FIGS. 3A to 3B are cross-sectional views depicting the method of manufacturing a probe card of the first embodiment (Part 3).

Then, as depicted in FIG. 2C, the lower face of the wiring substrate 5 in FIG. 2B is bonded on the copper layer 12 of the structure in FIG. 2A by an adhesive layer (not depicted). By this matter, it is in a state that the gold layer 14 on the copper foil 10 is exposed in the opening portion 5a of the wiring substrate 5. As the adhesive layer, an epoxy resin-based adhesive sheet, an epoxy resin-based liquid adhesive, or the like is used, for example, Then, as depicted in FIG. 3A, on the basis of wiring bonding, a tip part of a first gold wire 16a protruding from a wire bonders capillary not depicted) is rounded into a ball shape by electric discharge. Then, the capillary is lowered to touch the tip ball-shaped portion of the first gold wire 16a to the first connection pads P1 of the wiring substrate 5, and then while the tip ball-shaped portion is pressed, heating and ultrasonic vibration are performed, thereby the first gold wire 16a is bonded to the first connection pad P1.

Figure 3B:
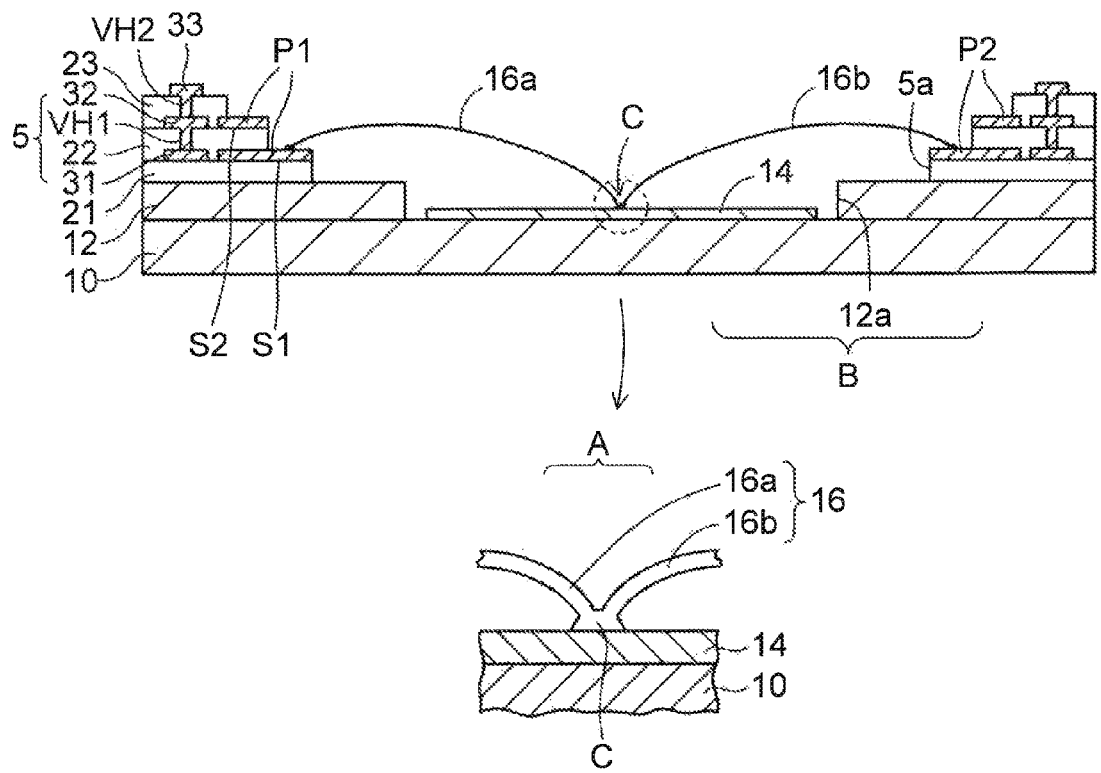

Thereafter, referring to FIG. 3B in addition to FIG. 3A, the capillary is raised to move the first gold wire 16a onto the cold layer 14 on the copper foil 10, and the first cold wire 16a is bonded to the gold layer 14 in a similar manner, thereby a gold bonding portion C connected to the first gold wire 16a is formed on the gold layer 14.

Many terminal positions A at which the contact terminals are arranged are defined on the surface of the gold layer 14, and the first gold wire 16a is bonded to the predetermined terminal position A in the gold layer 14a, thereby the gold. bonding portion C is arranged. For example, one terminal position corresponds to the section of one electrode pad of the test object.

Thereafter, as depicted in FIG. 38, the capillary is raised to move the first gold wire 16a to the second connection pads P2 of the wiring substrate 5 without cutting the first gold wire 16a and extend it as a second gold wire 16b, and the second gold wire 16b is bonded to the second connection pad P2. Thereafter, the second gold wire 16b is cut.

The series of steps in the above-described wire bonding are repeated, thus the first connection pads P1 of the wiring substrate 5, the terminal positions A on the gold layer 14, and the second connection pads P2 are bonded respectively one by one. Although not depicted in FIG. 3B, gold wires 16 bonded to gold bonding portions C are bonded similarly to the first connection pads P1 and the second, connection pads P2 on the second step face 52 of the wiring substrate 5 as well.

Figure 4A:
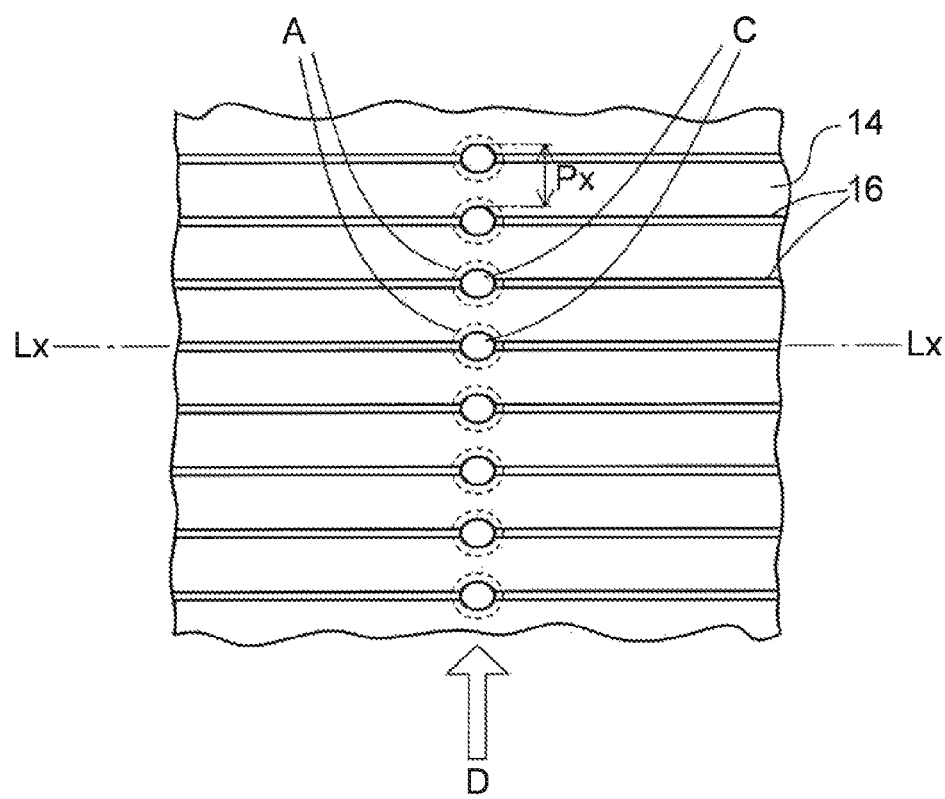
FIG. 4A is a partial plan view of a state that gold bonding portions in FIG. 3B are arranged with one row to a direction. perpendicular to the extending direction of gold wires.

FIG. 4A is a partial plan view depicting a state of the arrangement of the gold bonding portions C formed at the terminal positions. A on the gold layer 14. As depicted in FIG. 4A, the gold wires 16 each extend on one line Lx respectively and are arranged side by side in parallel each other, in a plan view. Moreover, the gold bonding portions C which are arranged at each of the terminal position A respectively are arranged with one row to a direction D perpendicular to the extending direction of the gold wires 16.

In this embodiment, as will be described later, finally, the root part in the two first and second gold wires 16a, 16b with the gold bonding portion C is serve as a pair of contact terminals, the two first and second gold wires 16a, 16b connected to the both side of the gold bonding portion C arranged at one terminal position A. Thus, four-terminal, testing can be performed.

An arrangement pitch Px of the gold bonding portions C (FIG. 4A) is determined by the limit specification of the wiring bonding technique employed. In the case of using gold wires 16 whose diameter is 10 µm to 20 µm, the arrangement pitch of wire can be made to the narrower pitch to about 40 µm or less.

In the case of not employing the wiring bonding of this embodiment, the distance between paired contact terminals for four-terminal testing is also determined by the limit specification of the wiring boding technique employed and is equivalent to the arrangement pitch Px in FIG. 4A. For this reason, it is impossible to form two contact terminals within the arrangement pitch Px, and it is difficult to realize the four-terminal testing with the narrower pitch.

Moreover, in the case of cutting each gold wire 16 once at its gold bonding portion C, the gold wire 16 is cut such that its tip part is crushed and widened. For this reason, when arranging a plurality of gold wires 16 in parallel with the first and second gold wires 16a, 16b formed on one line Lx, the arrangement pitch Px needs to be set wider by the amount that the gold wires 16 are crushed and widened in order to prevent interference between the adjacent lines.

On the other hand, in this embodiment, each gold wire 16 is not cut at its gold bonding portion C but is formed as a single continuous line Lx, thereby, the gold wire 16 is not widened by crushing. As the result, the adjacent lines can be arranged with the narrower pitch.

Moreover, by forming the first and second wires 16a, 16b on one line Lx continuously without cutting the gold wire 16 at the terminal position A, it is possible to prevent misalignment of the first wire 16a and the second wire 16b to the terminal position A. By this matter, even when the terminal positions A are made to the narrower pitch, two contact terminals can be arranged so as to correspond to one terminal position A.

Figure 4B:
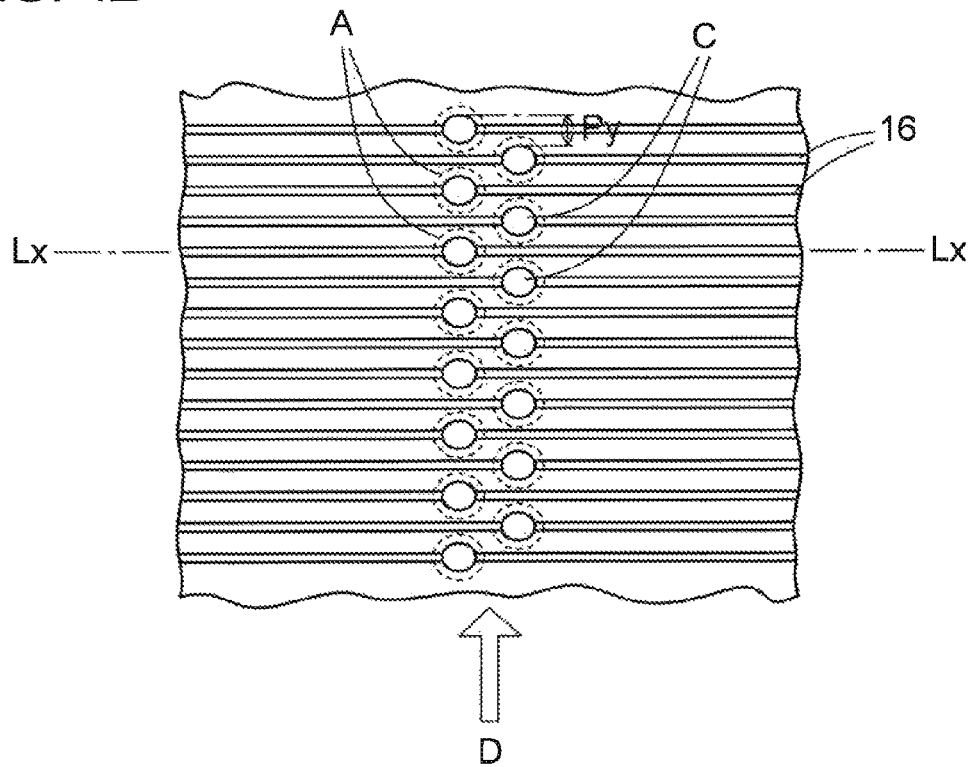
FIG. 4B is a partial plan view of a state that the gold bonding portions in FIG. 3B are arranged in a staggered arrangement to the direction perpendicular to the extending direction of the gold wires.

As depicted in FIG. 4B, in the case of further advancing the narrower pitch, the position of the gold bonding portion C is arranged to be shifted in every other wire to the extending direction of the gold wire 16, thus a staggered arrangement is constituted.

By this matter, the gold bonding portion C can be further arranged at the position of the half of the arrangement pitch Px of the gold bonding portions C in FIG. 4A. Accordingly, an arrangement pitch Py can be about 20 µm which is the half of the arrangement pitch Px in FIG. 4A. In this case, also each gold wire 16 extends on one line Lx in the plan view.

In this way, by arranging the gold bonding portions C so as to divide into two rows in the direction D perpendicular to the extending direction of the gold wires 16, to constitute the staggered arrangement, the arrangement pitch Py of the gold bonding portions C can be made to the narrower pitch.

The number of step faces of the wiring substrate 5 is adjusted according to the number of contact terminals. In this embodiment, the connection pads are arranged on the two first and second step faces, but, the number of connection pads can be increased by increasing the number of step faces according to the number of contact terminals.

In this embodiment, in order to bond the gold. bonding portions C to the surface of the copper foil 10 reliably by wiring bonding method, the gold layer 14 is formed as an adhesion layer on the copper foil 10. However, the gold layer 14 as such an adhesion layer is not necessarily required. It is possible to omit the gold layer 14 and bond the gold bonding portions C directly to the surface of the copper foil 10.

Alternatively, a silver (Ag) layer may be formed as an adhesion layer instead of the gold layer 14.

Moreover, copper wires may be used instead of the gold wires 16, and copper bonding portions may be formed on the copper foil 10. In the case of using copper wires, also, a gold layer or a silver layer is preferably formed as an adhesion layer on the copper foil 10.

Figure 5A:
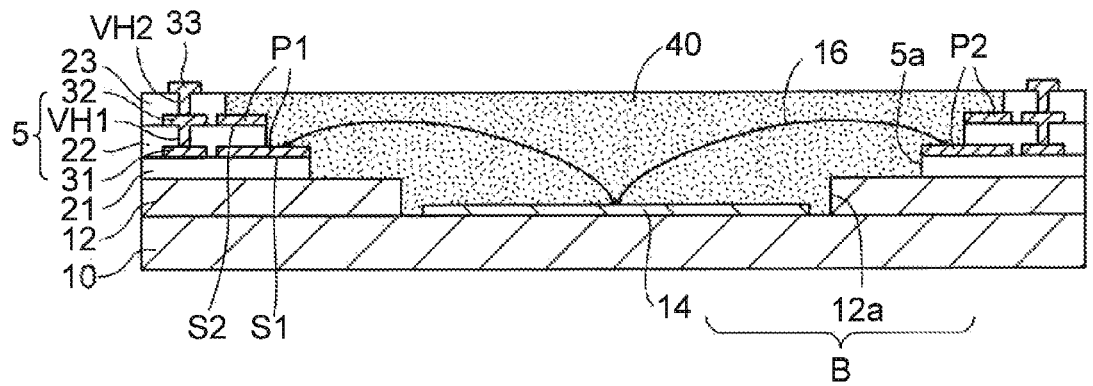
FIGS. 5A to 5C are cross-sectional views depicting the method of manufacturing a probe card of the first embodiment (Part 4).
Figure 6:
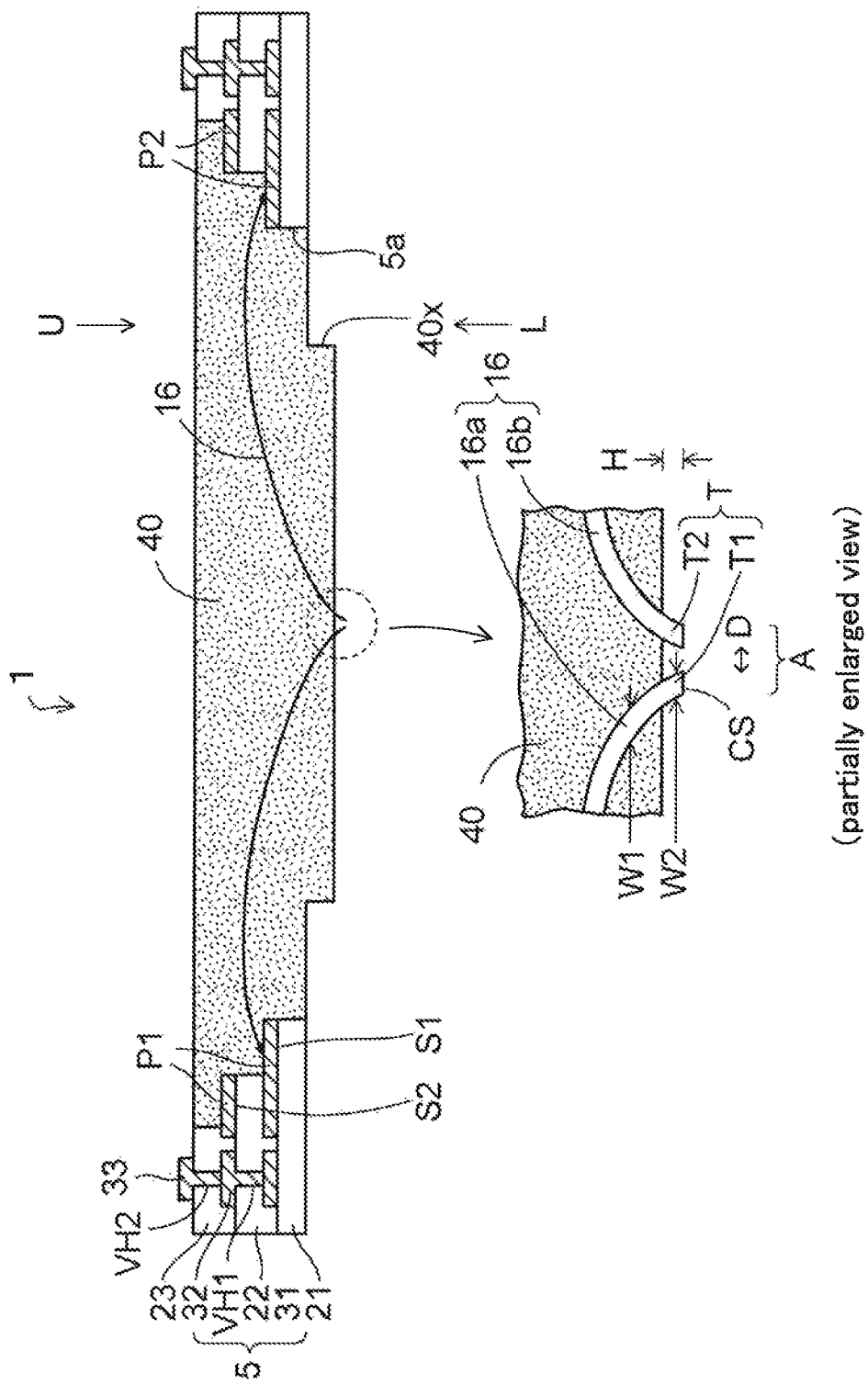
FIG. 6 is a cross-sectional view depicting a probe card of the first embodiment.

Then, as depicted in FIG. 5A, a liquid resin having low viscosity is coated into the opening portion 5a of the wiring substrate 5 in which the plurality of gold wires 16 are arranged, to fill the inside of the opening portion 5a with the liquid resin. Thereafter, the liquid resin is cured by a heating process to bury the plurality of gold wires 16 inside a resin portion 40.

The resin portion 40 is formed of a resin material having elasticity or a rubber material. A material with a Young's modulus of 1 MPa to 10 MPa such as a silicone-based low-elasticity resin or a fluororubber may be used as one preferred example. Alternatively, a low-elasticity acrylic resin, a urethane rubber, or the like may be used.

Figure 5B:
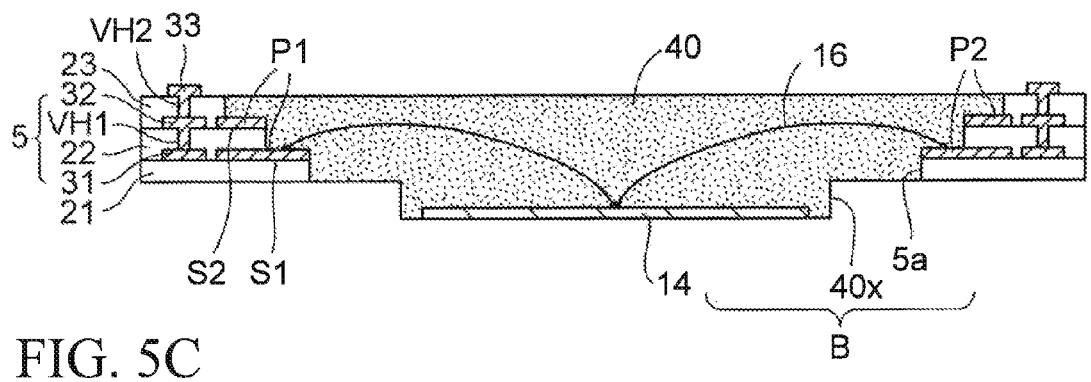

Then, as depicted in FIG. 5B, the copper foil 10 and the copper layer 12 are removed by wet etching. An iron(II) chloride aqueous solution, a copper(II) chloride aqueous solution, or the like is available as the copper etchant. By this matter, the copper foil 10 and the copper layer 12 can be selectively removed to the gold layer 14, the resin portion 40, and the first insulating layer 21 of the wiring substrate 5.

Thus, it is in a state that the lower face of a peripheral side of the resin portion 40 and the lower face of the gold layer 14 are exposed. The resin portion 40 is exposed such that it has a protruding portion 40x corresponding to the concave portion 12a of the copper layer 12 in FIG. 1D.

Alternatively, in the case of using a nickel foil instead of the copper foil 10, a mixed solution of aqueous hydrogen peroxide and nitric acid or the like is used as the etchant. In this way, selective removal to the base can likewise be performed.

As the metal base material, the member using the coil foil 10 or a nickel foil as the base is illustrated. It is possible to use a different metal material as long as it is a metal which can be selectively removed to the gold layer 14, the resin portion 40, and the first insulating layer 21 of the wiring substrate 5.

Figure 5C:
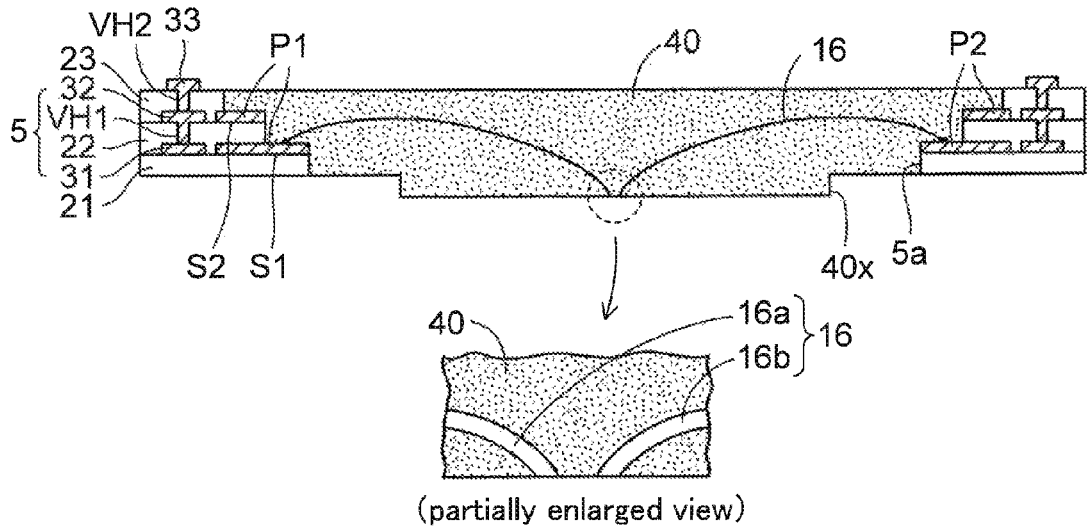

Then, as depicted in FIG. 5C, in the lower side of the structure in FIG. 5B, the gold layer 14 and the resin portion are polished by CMP (Chemical Mechanical Polishing), and further the polishing is performed until the exposed gold bonding portions C are completely removed.

By this matter, the gold bonding portions C are removed from the gold wires 16, thereby it is in a state that the gold wires 16 are separated into first gold wires 16a connected to the first connection pads P1 and second gold wires 16b connected to the second connection pads P2, and the first and second gold wires 16a, 16b become independent each other.

At this point, tip parts of the first and second gold wires 16a, 16b are in a state of being burled in the resin portion 40, and the polished faces of the first and second gold wires 16a, 16b and the polished face of the resin portion 40 are formed as the same face each other.

Then, as depicted in FIG. 6, the resin portion 40 of the lower side of the structure in FIG. 5C is selectively removed to the gold wires 16 by a predetermined depth by means of the dry etching. Such a thickness amount that the tip parts of the first and second gold wires 16a, 16b are exposed in a separated and independent state, is removed from the lower face of the resin portion 40.

The isotropic etching using a $CF_4/O_2$-based etching gas is preferably employed as Inc dry etching.

By this matter, the tip parts of the first and second gold wires 16a, 16b protrude from the lower face of the resin portion 40 respectively, thereby first contact terminals T1 and second contact terminals T2 are obtained. A protruding height H of the first and second contact terminals T1, T2 from the lower face of the resin portion 40 is about 0.1 μm, for example. However, the first and second contact terminals T1, T2 may protrude about 10 μm to 20 μm.

By the above steps, a probe card 1 of the first embodiment is obtained.

As depicted in FIG. 6, the probe card 1 of the first embodiment includes the frame-shaped wiring substrate 5 in which the opening portion 5a is provided in the center, explained in FIG. 2B mentioned above. In the wiring substrate 5, the first connection pads P1 and the second connection pads P2 are arranged in the opposite areas through the opening portion 5a respectively.

The resin portion 40 is filled in the opening portion 5a of the wiring substrate 5. The resin portion 40 has the protruding portion 40x protruding downward from the lower face of the wiring substrate 5. Then, the first gold wires 16a and the second gold wires 16b are buried in the resin portion 40. One end of each first gold wire 16a is connected to the first connection pad P1, and the other end protrudes from the lower face of the resin portion 40, thus a first contact terminal T1 is constitutes.

Moreover, one end of each second gold wire 16b is connected to the second connection pad P2, and the other end protrudes from the lower face of the resin portion 40, thus a second contact terminal T1 is constituted.

Figure 7A:
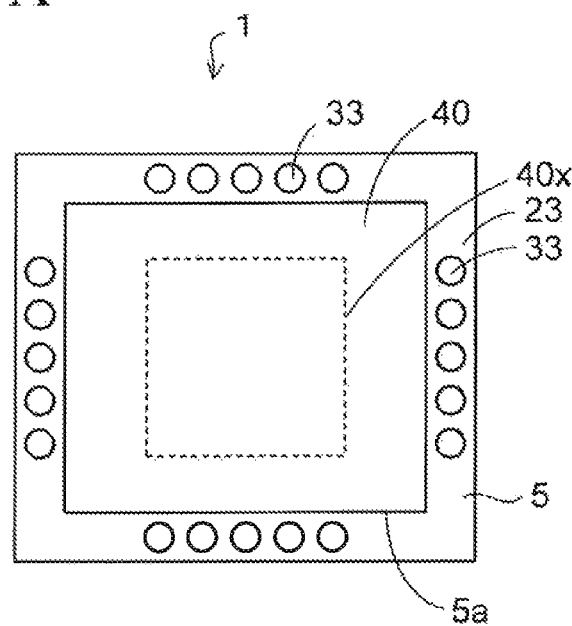
FIG. 7A is a reduced plan view of the probe card in FIG. 6 as seen from above.
Figure 7B:
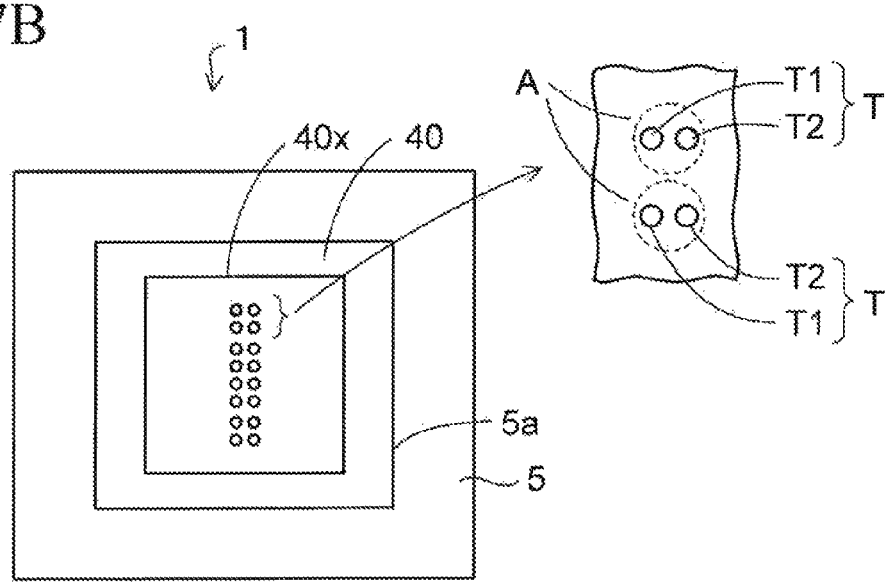
FIG. 7B is a reduced plan view of the probe card in FIG. 6 as seen from below.

FIG. 7A is a reduced plan view of FIG. 6 as seen from an upper side U, and FIG. 7B is a reduced plan view of FIG. 6 as seen from a lower side L.

Referring to FIG. 7A in addition to FIG. 6, the resin portion 40 is filled in the quadrangle opening portion 5a in the center of the wiring substrate 5. Moreover, the third wiring lavers 33 (pads) are arranged side by side along the frame area having four sides of the wiring substrate 5.

Moreover, referring to FIG. 7B in addition to FIG. 6, the first and second contact terminals T1, T2 are arranged at the terminal positions A on the lower face of the protruding portion 40x of the resin portion 40 respectively, and pairs of terminals, each pair formed of the first and second contact terminals T1, T2, are arranged side by side with one row.

The probe card 1 of this embodiment can be adapted to four-terminal testing. The first contact terminal T1 and the second contact terminal T2 are a pair of terminals for four-terminal testing and are gathered to be separated each other at the terminal positions A corresponding to one of the electrode pads of the test object.

As depicted in FIGS. 6 and 7B, two first and second contact terminals T1, T2 for four-terminal testing are arranged site by side in a short distance at one terminal position A. A distance D between the first and second contact. terminals T1, T2 in FIG. 6 is set to about 2 μm to 5 μm, for example.

Figure 8A:
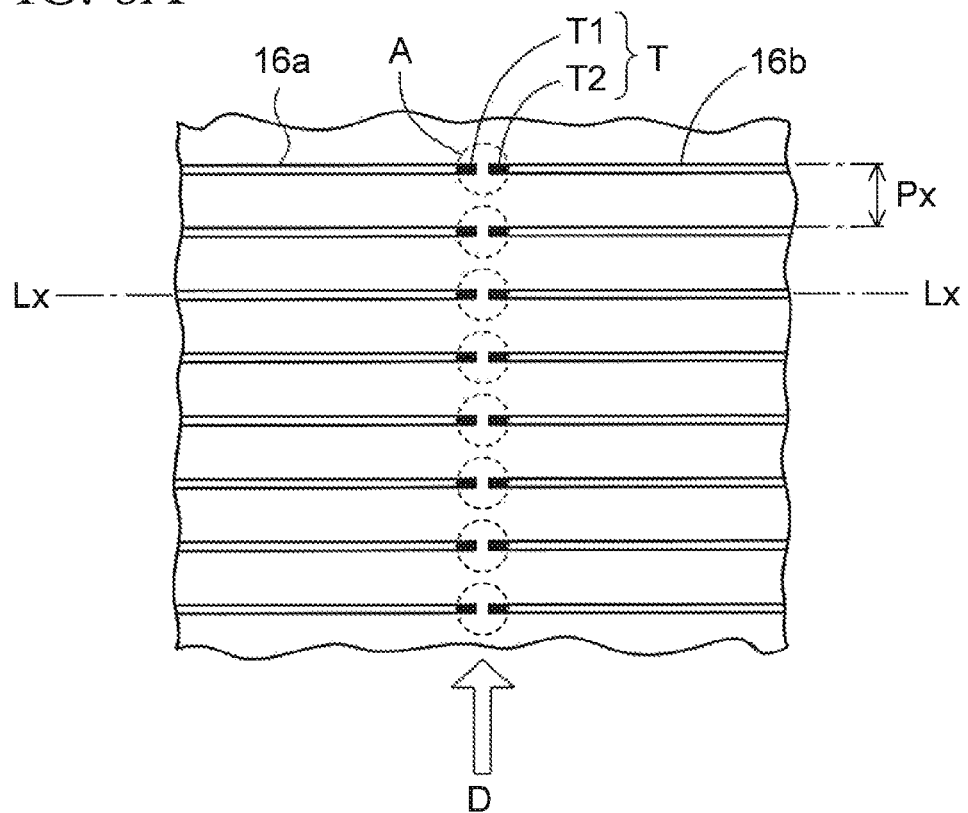
FIG. 8A is a partial plan view depicting a state that pairs of terminal, each pair formed of first and second contact terminals in FIG. 6, are arranged with one row to the direction perpendicular to the extending direction of the gold wires.

FIG. 8A depicts a state of the arrangement of the contact terminals obtained in the case that the gold bonding portions C are arranged with one row like FIG. 4A mentioned above. FIG. 8A. is a partial plan view of FIG. 6 as seen from above in a perspective view. In FIG. 8A, the gold wires 16 are depicted as blank figures and the first and second contact terminals T1, T2 are depicted as painted figures.

Referring to FIG. 8A in addition. to FIG. 6, the first wire 16a and the second wire 16b extend on one line Lx. The first contact terminal T1 formed of the tip part of the first wire 16a and the second contact terminal 12 formed of the tip part of the second wire 16b are arranged side by side at the terminal position A on that line Lx.

Moreover, a plurality of pairs of wires, each pair formed of the first. wire 16a and the second wire 16b, are arranged side by side in parallel inside the opening portion 5a of the wiring substrate 5. Then, pairs of terminals, each pair formed of the first contact terminal T1 and the second contact terminal T2, are arranged side by side with one row to the direction P perpendicular to the extending direction of the first and second wires 16a, 16b.

Figure 8B:
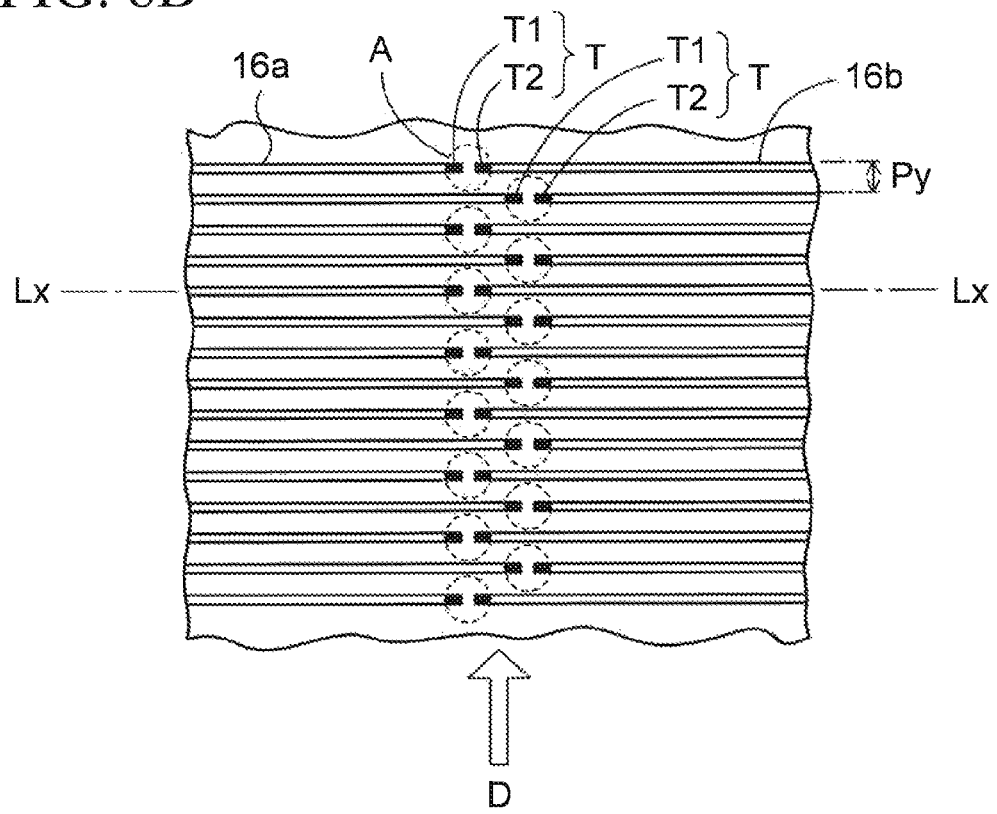
FIG. 8B is a partial plan view depicting a state that the pairs of terminals, each pair formed of the first and second contact terminals in FIG. 6, are arranged in a staggered arrangement to the direction perpendicular to the extending direction of the gold wires.

Moreover, FIG. 8B depicts a state of the arrangement of the contact terminals obtained in the case that the gold bonding portions C are arranged with the staggered arrangement like FIG. 4B mentioned earlier. In FIG. 8B, also, the gold wires 16 are depicted as the blank figures and the first and second contact terminals T1, T2 are depicted as the painted figures.

As depicted in FIG. 8B, like FIG. 8A mentioned above, the first wire 16a and the second wire 16b extend on one line Lx. The first contact terminal T1 formed of the tip part of the first wire 16a and the second contact terminal. T2 formed of the tip part of the second wire 16b are arranged side by site at the terminal position A on that line Lx.

In FIG. 4B mentioned above, the terminal positions A are defined with the staggered. arrangement and the gold bonding portions C are arranged at those terminal positions A. Therefore, two first and second contact terminals T1, T2 obtained by removing the gold bonding portions C are likewise arranged with the staggered arrangement.

In this way, the plurality of pairs of terminals, each pair formed of the first and second contact terminals T1, T2, are arranged with two rows to the direction D perpendicular to the extending direction of the first and second wires 16a, 16b, thereby the staggered arrangement is constituted.

As explained in FIG. 4B mentioned above, by arranging the terminal positions A with the staggered arrangement, the arrangement pitch Py of the pairs of terminals, each pair formed of two first and second contact terminals T1, T2, can be narrowed to the half of the arrangement pitch Px of the pairs of terminals in FIG. 8A.

Moreover, as depicted in the partially enlarged cross-sectional view in FIG. 6, a contact face CS of the tip of each contact terminal T is formed as a flat face. Further, since the contact terminal T is formed of the tip part of the gold wire 16, a diameter W1 of the contact terminal T protruding from the resin portion 40 is equal to a diameter W2 of the gold wire 16 buried, in the resin portion 40.

Furthermore, two first and second contact terminals T1, T2 are inclined in the reverse directions each other such that the distance therebetween narrows gradually as the position becomes their tip sides.

In this embodiment, unlike the prior art, terminals having a spherical shape or the like which is thicker than the gold wires 16 are not used as the contact terminals T. Therefore, the diameter of one contact terminal T can be made small. For this reason, it is possible to form the pair of contact terminals T in which two first and second contact terminals T1, T2 are aligned with a narrow distance. As a result, it is possible to constitute a four-terminal testing probe card which can be adapted to the narrower pitch of the electrode pads of test objects as well.

The plurality of gold wires 16 are buried in the resin portion 40 and held by the resin portion 40. The resin portion 40 is formed of a silicone-based low-elasticity resin, a fluororubber, or the like and has moderate elasticity.

Each gold wire 16 is drawn around in the resin portion 40, and the tip part of the gold wire 16 protrudes from the lower face of the protruding portion 40x of the resin portion 40, thus the contact terminal T is constituted. By this matter, when the resin portion 40 having the elasticity is pressed downward, appropriate contact pressure can be applied to each contact terminal T.

The resin portion 40 has the protruding portion 40x, thereby the resin portion 40 can be elastically deformed more easily. Accordingly, the contact of the contact terminals T to the test object can be made stable.

Note that, in the case that the protruding portion 40x is not necessary, the protruding portion 40x of the resin portion 40 may be omitted. In this case, the steps in FIGS. 1B to 1D mentioned above are omitted, and such a structure is obtained in the probe card 1 in FIG. 5 that the lower face of the resin portion 40 and the lower face of the wiring substrate 5 are formed as the same face each other.

Moreover, in the probe card 1 of this embodiment, the contact terminal T, and the wire for electrically connecting the contact terminal T and the wiring substrate 5 can be integrally formed by using the single gold wire 16. Therefore, the probe card can be manufactured at a good yield and at a low cost.

Next, a method of measuring electric characteristics of a test object by using the probe card 1 of the first embodiment will be explained.

Figure 9:
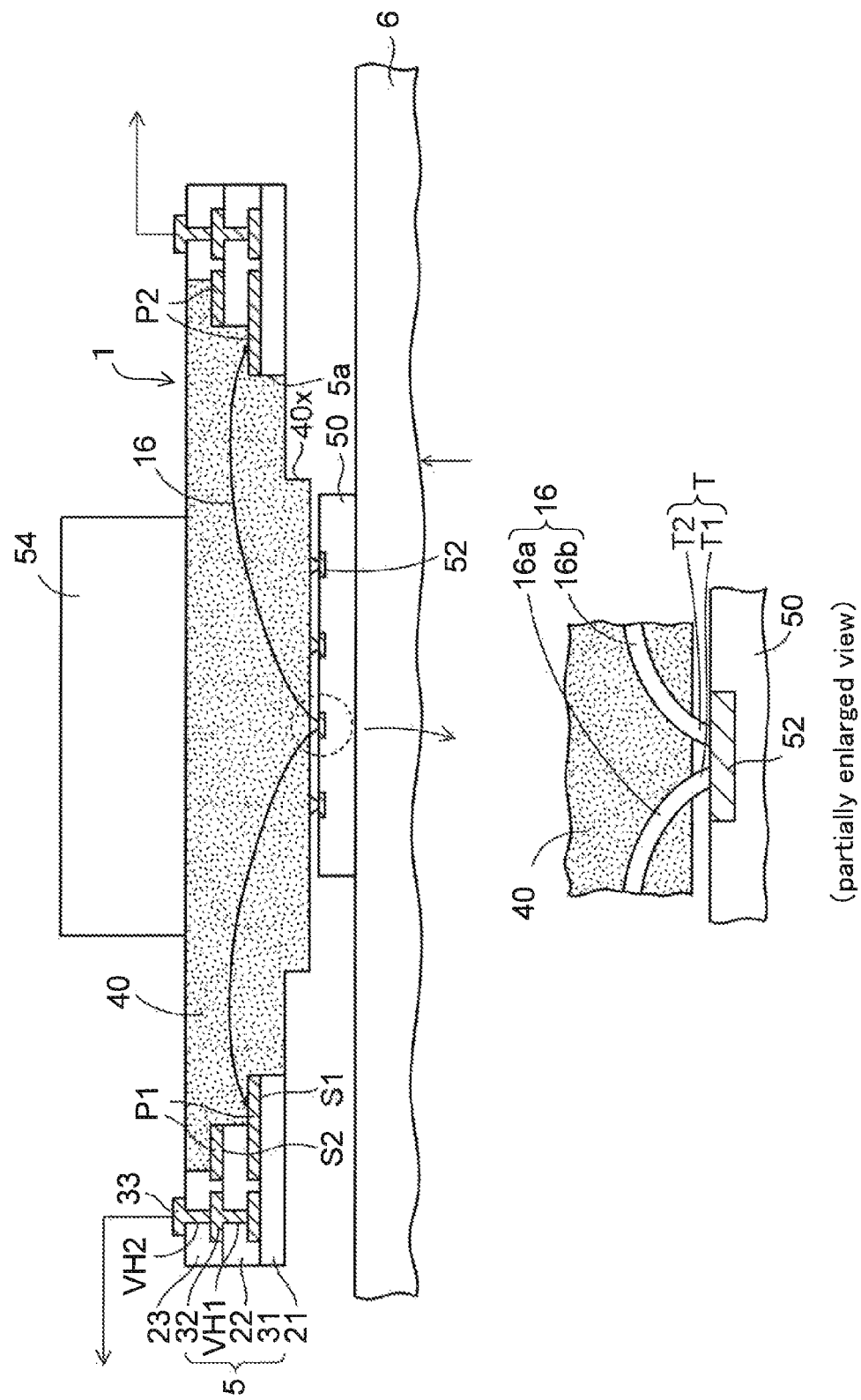
FIG. 9 is a cross-sectional view depicting a state that electric characteristics of a wiring substrate are measured by the probe card in FIG. 6.

As depicted in FIG. 9, terminals of a testing device (not depicted) such as an measuring instrument are electrically connected to the third wiring layers 33 (pads) of the probe card 1. Then, various test signals are supplied from the testing device to a test object through the probe card 1, thus the electric characteristics of the test object are measured.

FIG. 9 depicts an example of measuring the electric characteristics of a wiring substrate such as an interposer. The probe card 1 is arranged on a measuring-target wiring substrate 50 arranged on a stage 6 such that the contact terminals T of the probe card 1 touch electrode pads 52 of the wiring substrate 50.

As depicted in the partially enlarged view in FIG. 9, the probe card 1 of this embodiment can be adapted to the four-terminal testing. The first contact terminal T1 connected to the first gold wire 16a and the second contact terminal T2 connected to the different second gold wire 16b touch one electrode pad 52 of the measuring-target wiring substrate 50 in a separated state each other with a pair.

For example, the circuit connected to the first contact terminal T1 constitutes the current supplying circuit, and the circuit connected to the second contact terminal T2 constitutes the voltage measuring circuit.

in the case of general two-terminal testing, the wiring resistance of the probe card 1, and the contact resistance between the contact terminal T and the electrode pad 52 of the measuring-target wiring substrate 50 are included. Therefore, it is difficult to accurately measure the resistance value of only the measuring-target wiring substrate 50.

However, by employing the four-terminal testing, since the circuit in which electric current is caused to flow and the circuit in which voltage is measured are made independent each other, the wiring resistance and the contact resistance can be ignored. Accordingly, the resistance value of the wiring substrate 50 can be measured accurately.

Further, a pressing mechanism 54 is arranged on the resin portion 40 of the probe card 1, and the resin portion 40 is pressed downward. The pressing force of the pressing mechanism 54 is detected by load detecting means such a load cell and adjusted.

As mentioned above, the resin portion 40 has moderate elasticity. Therefore, the resin portion 40 follows the pressing force from the pressing mechanism 54, all the contact terminals T can be pressed to the electrode pads 52 of the wiring substrate 50 at moderate contact pressure.

In addition, since the resin portion 40 has the protruding portion 40x protruding from the lower face of the wiring substrate 5, the resin portion 40 can be elastically deformed more easily. Thus, the stability of contact of the contact terminals T can be improved.

In this way, the probe card 1 of this embodiment includes the pressing mechanism 54 for adjusting the contact pressure of the contact terminals T. By this matter, based on supplying the electric current from the testing device to the wiring substrate 50, electrical testing such as measuring the resistance value of the wiring substrate 50 can be performed reliably.

In this embodiment, in the case that the electrode pads 52 of the wiring substrate 50 are arranged with an area array type, at is made to scan. by one row, thereby the electric characteristics of all the electrode pads 52 of the wiring substrate 50 can be measured.

Note that, in this embodiment, the wiring substrate 50 such as the interposer or the like as the test object is illustrated. The probe card 1 can be used for electrical test of various other electronic components. As other electronic components, there is a semiconductor substrate such as a silicon wafer in which the semiconductor circuit is formed, or a module substrate in which a semiconductor chip is mounted on a wiring substrate.

Furthermore, a two-terminal testing probe card may be manufactured by using the manufacturing method of this embodiment.

(Second Embodiment)

Figure 10A:
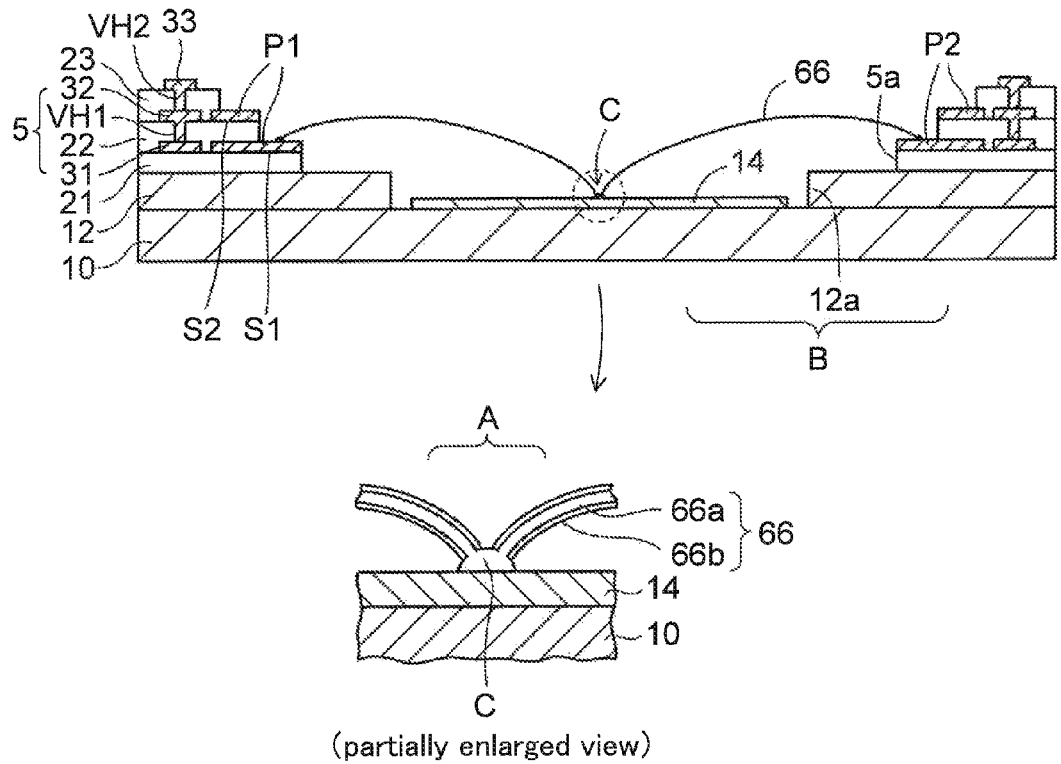
FIGS. 10A and 10B are cross-sectional views depicting a method of manufacturing a probe card of a second embodiment.
Figure 11:
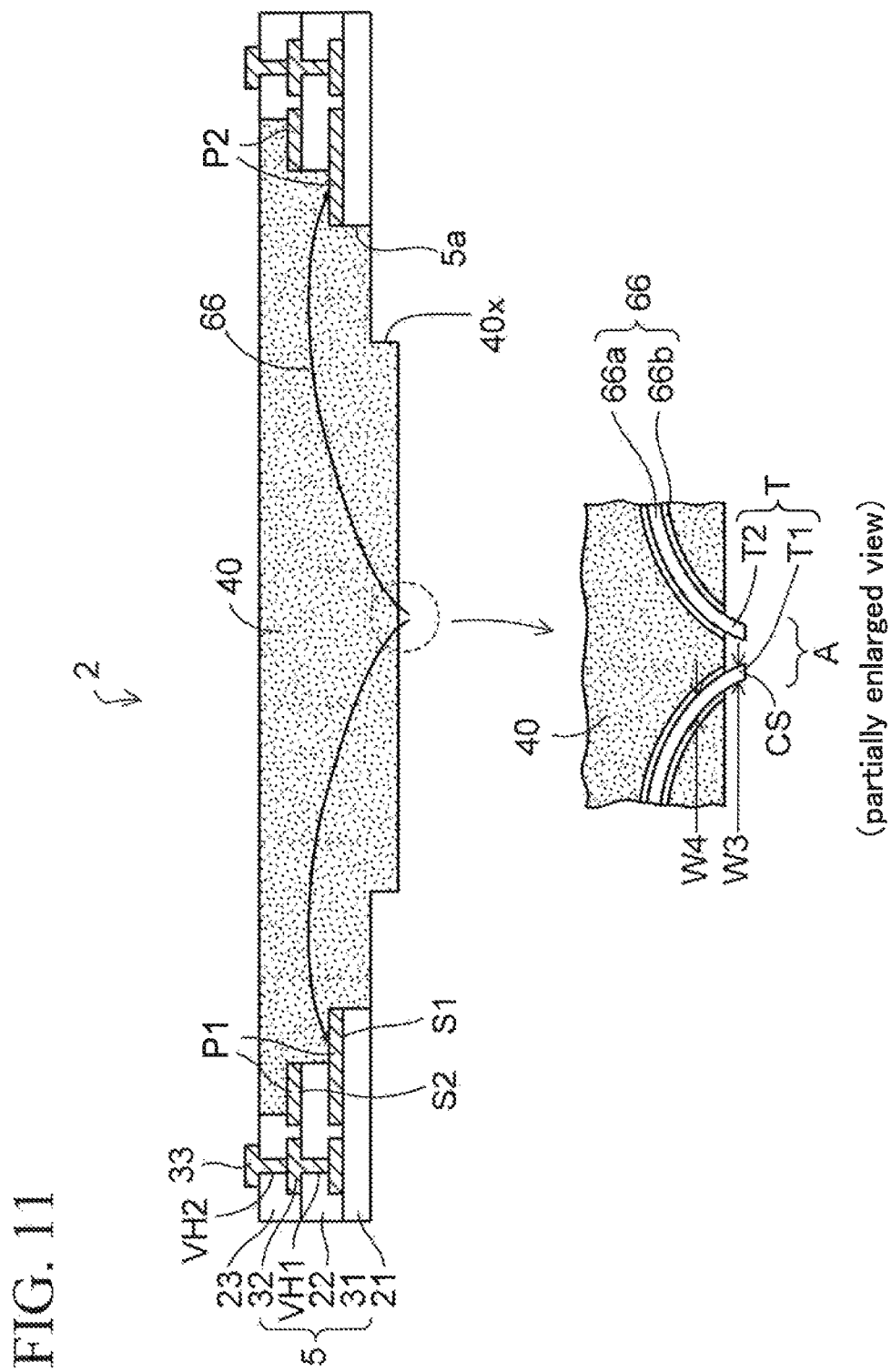
FIG. 11 is a cross-sectional view depicting a probe card of the second embodiment.

FIGS. 10A and 10E are views depicting a method of manufacturing a probe card of a second embodiment. FIG. 11 is a view depicting a probe card of the second embodiment. In the second embodiment, gold wires with insulation coating are used.

In the method of manufacturing a probe card of the second embodiment, as depicted in FIG. 10A, gold wires 66 with insulation coating are used instead of the gold wires 16 used in the first embodiment. The gold wires 66 with insulation coating are each formed of a gold wire portion 66a and an insulation coating portion 66b made of resin or the like coating the outer face thereof.

Then, like FIGS. 3A and 3B in the first embodiment, the first connection pads P1 of the wiring substrate 5, the terminal positions A on the gold layer 14, and the second connection pads P2 are connected by the gold wires 66 with insulation coating. In the gold wires 66 with insulation coating, when the wire bonding is performed, the insulation coating portion 66b is ripped and the gold wire portion 66a is bonded to each spot.

In this way, like the first embodiment, the first connection pads P1 of the wiring substrate 5, the terminal positions A on the gold layer 14 on the copper foil 10, and the second connection pads P2 are bonded by the gold wire portions 66a, and gold bonding portions C are formed at each terminal position A on the gold layer 14.

Figure 10B:
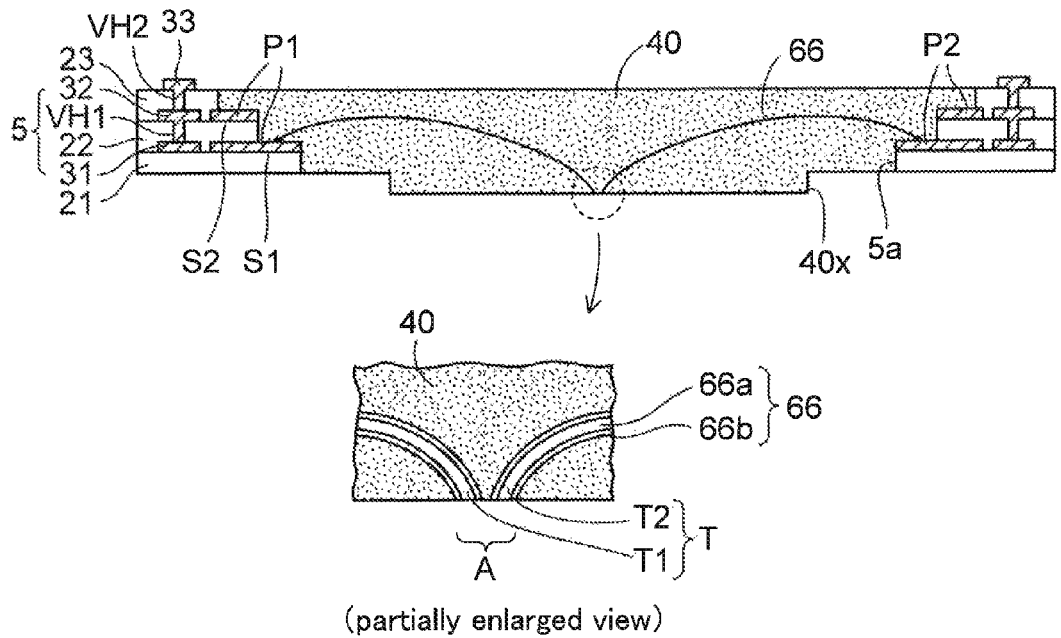

Then, as depicted in FIG. 10B, the same steps as those in FIGS, 5A to 5C in the first embodiment are performed, thereby the polished faces of the gold wires 66 with insulation coating and the polished face of a resin portion 40 are made to the same face each other.

Thereafter, as depicted in FIG. 11, by using a similar method to FIG. 6 in the first embodiment, the resin portion 40 is removed by a predetermined depth by means of the dry etching from the lower face of the resin portion 40. Such a thickness amount that the tip parts of the gold wire portions 66a are exposed in a separated and independent state, is removed from the lower face of the resin portion 40.

In this step, the insulation coating portions 66b coating the gold wire portions 66a are etched with the resin portions simultaneously and removed, thereby the tip parts of the gold wire portions 66a are exposed.

By this matter, the tip parts of the gold wire portions 66a protrude from the lower face of the resin portion 40, thereby first and second contact terminals T1, T2 are obtained, at each terminal position A. By the above steps, a probe card 2 of the second embodiment is manufactured.

As depicted in the partially enlarged sectional view in FIG. 11, a contact face CS of the tip of each contact terminal T is formed as a flat face. Moreover, since the contact terminal T is formed of the tip part of the gold wire portion 66a, a diameter W3 of the contact terminal T protruding from the resin portion 40 is equal to a diameter W4 of the gold wire portion 66a buried in the resin portion 40.

Furthermore, two first and second contact terminals T1, T2 are inclined in the reverse directions each other such that the distance therebetween narrows gradually as the position becomes their tip sides.

In the second embodiment, since the gold wires 66 with insulation coating are used, there is no fear that a short circuit is caused even when wires touch each other. For this reason, it is no longer necessary to care about contact of the wires, and therefore the freedom degree of drawing around the wires can be improved. Accordingly, the wire bonding with the narrower pitch is possible, and further narrower pitch of the contact terminals can be attained.

The probe card 2 of the second embodiment brings about advantageous effects similar to the probe card 1 of the first embodiment.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present. invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a probe card, comprising:
preparing a wiring substrate including an opening portion, a first connection pad and a second connection pad, the first connection pad arranged in one area of a periphery of the opening portion, the second connection pad arranged in another area of a periphery of the opening portion, the another area which is opposed to the first connection pad;
bonding the wiring substrate to a metal base material;
connecting the first connection pad, a terminal position in the metal base material, and the second connection pad by a wire sequentially to form a bonding portion at the terminal position in the metal base material;
forming a resin portion in the opening portion of the wiring substrate, the resin portion burying the wire;
removing the metal base material;

removing the bonding portion from the wire by polishing the resin portion from a lower face, to separate into a first wire connected to the first connection pad and a second wire connected to the second connection pad; and obtaining a first contact terminal and a second contact terminal by removing the resin portion from the lower face such that tip parts of the first wire and the second wire protrude from the lower face of the resin portion respectively, wherein the first wire and the second wire extend on one line, and the first contact terminal and the second contact terminal are arranged side by side on the one line, and the first contact terminal and the second contact terminal are gathered to be separated each other such that the first and second contact terminals touch one electrode pad of a test object with a pair.

(Clause 2) The method. of manufacturing a probe card according to Clause 1, wherein.

each diameter of the first contact terminal and the second contact terminal is equal to each diameter of the first wire and the second wire in the resin portion, and a contact face of a tip of each of the first contact terminal and the second contact terminal is formed as a flat face, (Clause 3) The method of manufacturing a probe card according to Clause 1, wherein a plurality of pairs of wires, each pair formed of the first wire and the second wire, are arranged side by side in parallel in the opening portion of the wiring substrate, and pairs of contact terminals, each pair formed of the first contact terminal and the second contact terminal, are arranged side by side with one row to a direction perpendicular to an extending direction of the wires.

(Clause 4) The method of manufacturing a probe card according to Clause 1, wherein a plurality of pairs of wires, each pair formed of the first wire and the second wire, are arranged side by side in parallel in the opening portion of the wiring substrate, and pairs of contact terminals, each pair formed of the first contact terminal and the second. contact terminal, are arranged with a staggered arrangement to a direction perpendicular to an extending direction of the wires.

(Clause 5) The method of manufacturing a probe card according to Clause 1, wherein each of the wires is a wire with insulation coating.

The invention claimed is:

1. A probe card, comprising:
a wiring substrate including an insulating layer and a wiring layer formed on the insulating layer;
an opening portion penetrating the insulating layer and the wiring layer of the wiring substrate in a thickness direction, the opening portion having a quadrangle shape in a plan view, wherein four side faces of the opening portion are formed in a step shape, and have step faces;
a first connection pad formed on the step faces of the side faces of the opening portion of the wiring substrate;
a second connection pad formed on the step faces of the side faces of the opening portion of the wiring substrate, wherein the first connection pad and the second connection pad are arranged, so as to oppose, in facing step faces in the four side faces of the opening portion, wherein the first connection pad and the second connection pad are exposed from an inner face of the opening portion, the first connection pad and the second connection pad each connected to one of the wiring layer;
a resin portion formed in the opening portion of the wiring substrate, the resin portion burying the first connection pad and the second connection pad;
a first bonding wire buried in the resin portion, the first bonding wire in which one end is connected to the first connection pad and the other end constitutes a protruding portion protruding from a lower face of the resin portion, the lower face which is located to a reverse face side to a face on which the first and second connection pads are arranged;
a first contact terminal formed from the protruding portion of the first bonding wire, the first contact terminal protruding downward from the lower face of the resin portion, in a state that a whole of a side face of the first contact terminal is exposed from the resin portion, wherein the first contact terminal and the first bonding wire are formed of one bonding wire which is made of the same metal;
a second bonding wire buried in the resin portion, the second wire in which one end is connected to the second connection pad and the other end constitutes a protruding portion protruding from the lower face of the resin portion; and
a second contact terminal formed from the protruding portion of the second bonding wire, the second contact terminal protruding downward from the lower face of the resin portion, in a state that a whole of a side face of the second contact terminal is exposed from the resin portion, wherein the second contact terminal and the second bonding wire are formed of one bonding wire which is made of the same metal,
wherein each diameter of the first contact terminal and the second contact terminal is equal to each diameter of the first wire and the second wire buried in the resin portion, and
the first bonding wire and the second bonding wire extend on one line in a plan view, and the first contact terminal and the second contact terminal are arranged side by side on the one line, and
the first bonding wire having the first contact terminal in a tip side is arranged to be opposite to the second bonding wire having the second contact terminal in a tip side, such that a distance between the first bonding wire and the second bonding wire narrows gradually as a position becomes the tip side, and
the first contact terminal and the second contact terminal contact one electrode pad of a test object in a pair.

2. The probe card according to claim 1, wherein
a contact face of a tip of each of the first contact terminal and the second contact terminal is formed as a flat face.

3. The probe card according to claim 1, wherein
a plurality of pairs of wires, each pair formed of the first bonding wire and the second bonding wire, are arranged side by side in parallel in the opening portion of the wiring substrate, and
pairs of contact terminals, each pair formed of the first contact terminal and the second contact terminal, are arranged side by side with one row to a direction perpendicular to an extending direction of the wires.

4. The probe card according to claim 1, wherein
a plurality of pairs of wires, each pair formed of the first bonding wire and the second bonding wire, are arranged side by side in parallel in the opening portion of the wiring substrate, and pairs of contact terminals, each pair formed of the first contact terminal and the second contact terminal, are arranged with a staggered arrangement to a direction perpendicular to an extending direction of the wires.

5. The probe card according to claim 1, wherein each of the first and second bonding wires is a wire with insulation coating.

6. The probe card according to claim 1, wherein the resin portion has a protruding portion protruding downward from a second face of the wiring substrate.

* * * * *